(12) United States Patent
Ashckenazi et al.

(10) Patent No.: US 9,473,068 B2
(45) Date of Patent: Oct. 18, 2016

(54) VOLTAGE-CONTROLLED OSCILLATOR WITH REDUCED SINGLE-ENDED CAPACITANCE

(71) Applicant: Intel Corporation, Santa Clara, CA (US)

(72) Inventors: Ori Ashckenazi, Hefer (IL); Rotem Banin, Zur Moshe (IL); Ofir Degani, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/754,108

(22) Filed: Jun. 29, 2015

(65) Prior Publication Data

US 2015/0372643 A1 Dec. 24, 2015

Related U.S. Application Data

(63) Continuation of application No. 13/997,592, filed as application No. PCT/US2011/065793 on Dec. 19, 2011, now Pat. No. 9,093,950.

(51) Int. Cl.
*H03B 5/12* (2006.01)

(52) U.S. Cl.
CPC ............ *H03B 5/1212* (2013.01); *H03B 5/124* (2013.01); *H03B 5/1228* (2013.01); *H03B 5/1243* (2013.01); *H03B 5/1265* (2013.01); *H03B 5/1296* (2013.01)

(58) Field of Classification Search
CPC .................................................. H03B 5/1296
See application file for complete search history.

(56) References Cited

U.S. PATENT DOCUMENTS

| 6,150,893 A * | 11/2000 | Fattaruso ................. H03B 7/06 331/117 R |
|---|---|---|
| 2006/0033587 A1 | 2/2006 | Cabanillas |
| 2006/0181355 A1 | 8/2006 | Copani et al. |
| 2007/0103248 A1 | 5/2007 | Nakamura et al. |

(Continued)

FOREIGN PATENT DOCUMENTS

| CN | 102035467 | 4/2011 |
|---|---|---|
| EP | 0905876 A1 | 3/1999 |

(Continued)

OTHER PUBLICATIONS

European Patent Office; Search Report for European App. No. 11878290.3 dated Jul. 1, 2015; 9 pages.

(Continued)

*Primary Examiner* — Tuan H Nguyen
(74) *Attorney, Agent, or Firm* — Schwabe, Williamson & Wyatt, P.C.

(57) ABSTRACT

Embodiments provide a voltage controlled oscillator (VCO) having reduced single-ended capacitance. In one embodiment, the VCO may include a transformer, a capacitor bank, and a gain stage. The transformer may include a primary inductor and a secondary inductor, and the secondary inductor may be inductively coupled to the primary inductor. The capacitor bank may be coupled to the secondary inductor and may provide a majority of a total capacitance of the VCO. The gain stage may be coupled to the primary inductor and configured to receive a supply signal and to drive a differential current in the primary inductor, thereby inducing an output signal across the secondary inductor having a frequency equal to a resonant frequency of the VCO.

26 Claims, 3 Drawing Sheets

(56) References Cited

U.S. PATENT DOCUMENTS

| | | |
|---|---|---|
| 2008/0284534 A1 | 11/2008 | El Rai |
| 2010/0225407 A1 | 9/2010 | Goyal et al. |
| 2010/0277250 A1 | 11/2010 | Aga et al. |
| 2011/0018645 A1* | 1/2011 | Chang .................. H03B 5/1225 331/115 |

FOREIGN PATENT DOCUMENTS

| | | |
|---|---|---|
| JP | 2007267353 A | 10/2007 |
| WO | 2009041868 A1 | 4/2009 |

OTHER PUBLICATIONS

Japanese Patent Office; First Office Action for Japanese App. No. 2014-545873 mailed Sep. 1, 2015; 10 pages inclusive of English translation.

Jin-Siang Syu; "Site HBT Quadrature VCO Utilizing Trifilar Transformers"; IEEE Asian Solid-State Circuits Conference; Nov. 3-5, 2008; Fukuoka, Japan; 5 pages.

International Search Report and Written Opinion mailed Sep. 7, 2012 from International Application No. PCT/US2011/065793.

M.S. et al., "A Low-Noise Transformer-Based 1.7GHz CMOS VCO," 2002 IEEE International Solid-State Circuits Conference, ISSCC 2002 / Session 17 / Advanced RF Techniques / 17.1, pp. 286-287, See abstract, figure 17.1.1, and corresponding detailed description.

Baek et al., "8-GHz CMOS Quadrature VCO Using Transformer-Based LC Tank," IEEE Microwave and Wireless Components Letters, vol. 13, No. 10, Oct. 2003, pp. 446-448, See abstract, figure 1 and corresponding detailed description.

Song et al., "A 5GHz Transformer-Coupled CMOS VCO Using Bias-Level Shifting Technique," MO2C-3, 2004 IEEE Radio Frequency Integrated Circuits Symposium, Jun. 6-8, 2004, pp. 127-130, See abstract, figure 4 and corresponding detailed description.

Chuang et al., "A New CMOS VCO Topology with Capacitive Degeneration and Transformer Feedback," In: International Symposium on VLSI Design, Automation and Test, Apr. 26-28, 2006, pp. 1-4, See abstract, figure 4 and corresponding detailed description.

Andreani et al, "A 2.3GHz LC-Tank CMOS VCO with Optimal Phase Noise Performance," ISSCC 2006 / Session 11 / RF Building Blocks and PLLS / 11.2, 2006 IEEE International Solid-State Circuits Conference, Feb. 7, 2006, 10 pages.

International Preliminary Report on Patentability mailed Sep. 7, 2012 from International Application No. PCT/US2011/065793.

European Patent Office; Extended Search Report for European App. No. 15189232.0 dated Jan. 22, 2016; 11 pages.

Donghyun Baek et al.; "8-GHz CMOS Quadrature VCO Using Transformer-Based LC Tank," IEEE Microwave and Wireless Components Letters, vol. 13, No. 10; IEEE Service Center, New York, NY; Oct. 31, 2003; 3 pages.

Chinese State Intellectual Property Office; First Office Action mailed on Feb. 14, 2016 for Patent Application No. 201180075641.8; 42 pages.

Japanese Patent Office; Office Action mailed on Jun. 21, 2016 for Patent Application No. 2014-545873; 7 pages.

Matt Straayer et al.; "A Low-Noise Transformer-Based 1.7GHz CMOS VCO," ISSCC 2002, Session 17, Advanced RF Techniques 17.1; Feb. 6, 2002; 3 pages.

Chao-Chieh Li et al.; "A 21 GHz Complementary Transformer Coupled CMOS VCO," IEE Microwave and Wireless Components Letters, vol. 18, No. 4, Apr. 2008; 4 pages.

Donghyun Baek et al.; "8-GHz CMOS Quadrature VCO Using Transformer-Based LC Tank," IEE Microwave and Wireless Components Letters, vol. 13, No. 10, Oct. 2003; 4 pages.

* cited by examiner

VOLTAGE-CONTROLLED OSCILLATOR WITH REDUCED SINGLE-ENDED CAPACITANCE

TECHNICAL FIELD

Embodiments of the present disclosure relate generally to electronic circuits, and more particularly, to voltage-controlled oscillators.

BACKGROUND

Inductance-capacitance voltage controlled oscillators (LC-VCOs) are critical building blocks in communication systems, such as wireless communication systems. One of the main challenges in LC-VCO design is achieving low phase noise while keeping power consumption low. Single-ended parasitic capacitance is one of the biggest causes of phase noise in LC-VCO circuits.

BRIEF DESCRIPTION OF THE DRAWINGS

Embodiments of the present disclosure will be described by way of exemplary embodiments, but not limitations, illustrated in the accompanying drawings in which like references denote similar elements, and in which.

DETAILED DESCRIPTION

Figure 1A:
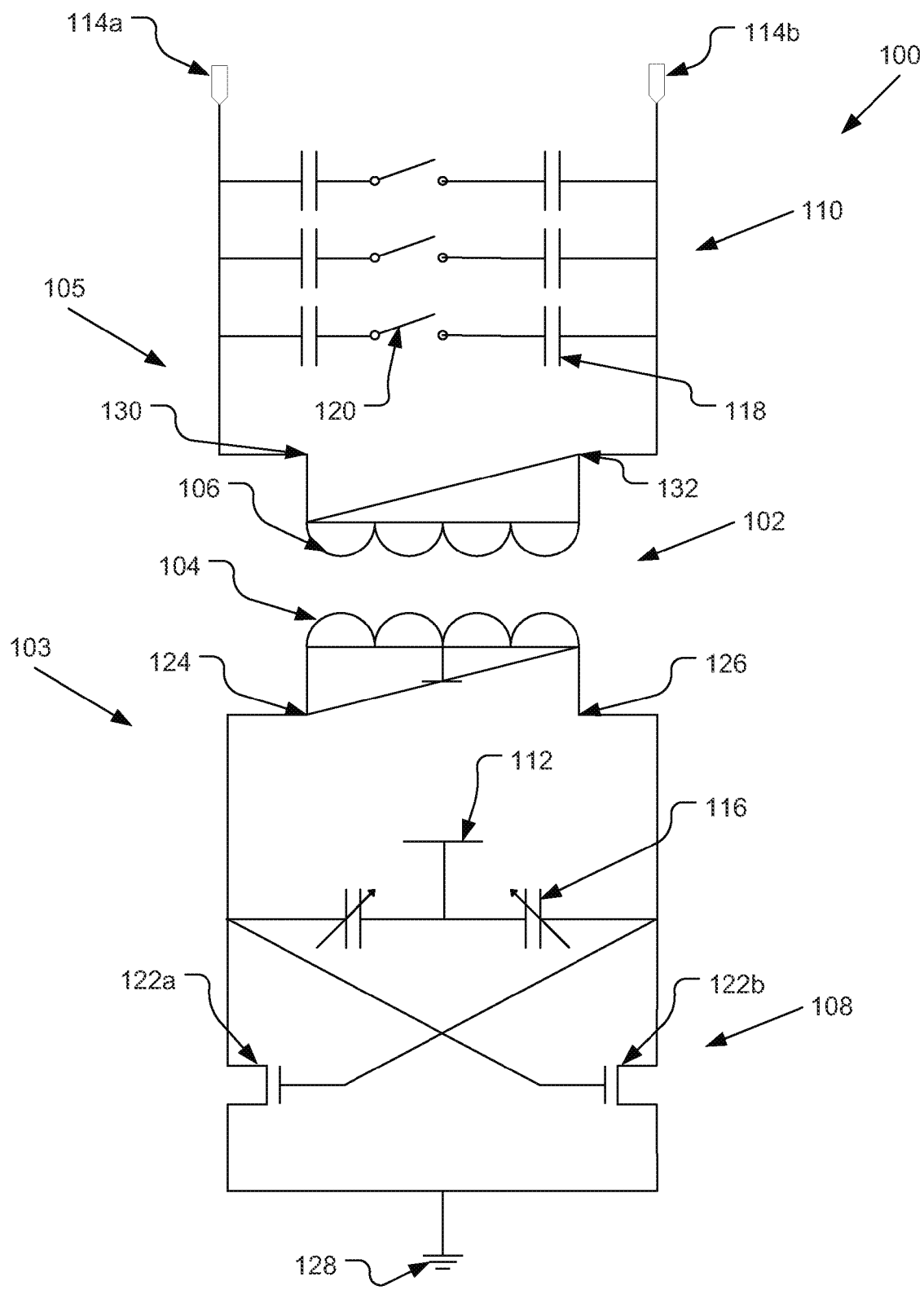
FIG. 1A is a circuit diagram of a voltage controlled oscillator in accordance with various embodiments.

Illustrative embodiments of the present disclosure include, but are not limited to, methods and apparatuses for voltage controlled oscillators having reduced single-ended capacitance.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific numbers, materials, and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the illustrative embodiments; however, the order of description should not be construed as to imply that these operations are necessarily order dependent. In particular, these operations need not be performed in the order of presentation.

The phrase "in some embodiments" is used repeatedly. The phrase generally does not refer to the same embodiments; however, it may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Although specific embodiments have been illustrated and described herein, it will be appreciated by those of ordinary skill in the art that a wide variety of alternate and/or equivalent implementations may be substituted for the specific embodiments shown and described, without departing from the scope of the embodiments of the present disclosure. This application is intended to cover any adaptations or variations of the embodiments discussed herein. Therefore, it is manifestly intended that the embodiments of the present disclosure be limited only by the claims and the equivalents thereof.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Various embodiments provide a voltage controlled oscillator (VCO) having reduced single-ended capacitance. In one embodiment, the VCO may include a transformer, a capacitor bank, and a gain stage. The transformer may include a primary inductor and a secondary inductor, and the secondary inductor may be inductively coupled to the primary inductor. The capacitor bank may be coupled to the secondary inductor, and the capacitor bank may provide a majority of a total capacitance of the VCO. The gain stage may be coupled to the primary inductor and configured to receive a supply signal and to drive a differential current in the primary inductor, thereby inducing an output signal across the secondary inductor having a frequency equal to a resonant frequency of the VCO. In some embodiments, the VCO may further include one or more varactors coupled to the gain stage in parallel with the primary inductor. In one embodiment, the varactors may receive the supply signal.

In one embodiment, the VCO circuit may include a gain stage including a first transistor and a second transistor, the first transistor having a first drain terminal coupled to a first node and the second transistor having a second drain terminal coupled to a second node. The circuit may further include a pair of varactors coupled between the first node and the second node and configured to receive a supply signal at a supply node between the pair of varactors. The circuit may further include a first inductor coupled between the first node and the second node, and a second inductor coupled between a third node and a fourth node, the second inductor inductively coupled to the first inductor. Additionally, the circuit may include a capacitor bank coupled between the third node and the fourth node, the capacitor bank including a plurality of switched capacitors configured to be selectively coupled between the third node and the fourth node when switched on. The capacitor bank may provide a majority of a total capacitance of the VCO.

FIG. 1A illustrates a VCO 100 in accordance with various embodiments. VCO 100 may be an inductance-capacitance VCO (LC-VCO) 100. In various embodiments, VCO 100 may include a transformer 102 having a primary stage 103 and a secondary stage 105. Primary stage 103 may include a primary inductor 104 and secondary stage 105 may include a secondary inductor 106. The VCO 100 may further include a gain stage 108 and a capacitor bank 110. The gain stage 108 may be coupled to the primary stage 103 and may receive an input signal (e.g., a supply voltage/current) to drive current in the primary inductor 104. The capacitor bank 110 may be coupled to the secondary stage 105 (e.g., coupled to the secondary inductor 106) and may include a majority of a total capacitance of the VCO 100.

In some embodiments, VCO 100 may receive the input signal at a supply node 112 and produce an output signal across output nodes 114a-b. The secondary inductor 106 may be inductively coupled to the primary inductor 104, so that a differential current (e.g., an alternating current (AC)) across the primary inductor 104 induces a differential voltage across the secondary inductor 106.

In various embodiments, the capacitor bank 110 may be coupled in parallel with the secondary inductor 106. The capacitance (e.g., from capacitor bank 110) and the inductance (e.g., from primary inductor 104 and/or secondary inductor 106) of the VCO 100 may cause the VCO 100 to convert a direct current (DC) input signal into an alternating current (AC) output signal having a frequency equal to a resonant frequency of the VCO 100. The gain stage 108 may provide gain to drive the differential current in the primary inductor 102, thereby sustaining the output signal.

In some embodiments, the capacitor bank 110 may include a plurality of switched capacitors 118. As shown in FIG. 1, in some embodiments, the switched capacitors 118 may be arranged in pairs with a switch 120 disposed between respective pairs of capacitors 118. Alternatively, the capacitors 118 may be arranged as single capacitors 118 and/or in another arrangement. The capacitors 118 may be selectively coupled in parallel with the second inductor 106 when the respective switch 120 is switched on. The switches 120 may be controlled on an individual basis, on a collective basis, or on a subset basis (e.g., individual subsets of switches 120 are controlled separately). The resonant frequency of the VCO 100 may be based on a quantity of switches 120 that are switched on at a particular time. In some embodiments, the VCO 100 may include any suitable number of switched capacitors 118, such as about 2 to about 1,024 pairs of switched capacitors 118.

In some embodiments, VCO 100 may include additional capacitive elements, such as one or more varactors 116. The resonant frequency of the VCO 100 may be further adjusted by changing a magnitude (e.g., voltage level) of the input signal, which may alter the capacitance of the varactors 116. In some embodiments, as shown in FIG. 1A, a pair of varactors 116 may be coupled to the gain stage 108 in parallel with the primary inductor 104. The supply node 112 may be disposed between the pair of varactors 116. In some embodiments, the capacitor bank 110 may include one or more varactors in addition to, or instead of varactors 116 coupled to the primary inductor 104.

In various embodiments, the capacitor bank 110 may provide a majority of the total capacitance of the VCO 100. The capacitor bank 110 may be a significant source of single-ended capacitance. As used herein, single-ended capacitance may be defined as capacitance between an output node 114a or 114b and ground. Single-ended capacitance may be distinguished from differential capacitance between the pair of output nodes 114a-b. If the single-ended capacitance is passed to the gain stage 108 (as may occur in VCO topologies in which the gain stage directly drives the capacitor bank), it may cause phase noise in the output signal. However, transformer 102 may prevent the single-ended capacitance caused by capacitor bank 110 from passing to the gain stage 108. Rather, only differential capacitance may pass between secondary inductor 106 and primary inductor 104. Accordingly, by having a majority of the total capacitance off VCO 100 coupled to the secondary stage 105 (e.g., coupled to secondary inductor 106), the single-ended capacitance of VCO 100 may be substantially reduced. Accordingly, VCO 100 may have low phase noise. Additionally, the power consumption of VCO 100 may be relatively small.

In one experiment, a 58 GHz VCO with a switched capacitor bank coupled to the secondary stage of a transformer exhibited a phase noise of about −110 dBc/Hz (decibels below the carrier per Hertz of bandwidth) at 1 MHz offset from carrier and a bandwidth of 2 GHz. These results demonstrate a phase noise below that provided by other VCO designs.

In some embodiments, substantially all of the total capacitance of the VCO 100 may be coupled to the secondary inductor 106. For example, all of the switched capacitors 118 in VCO 100 may be coupled to secondary inductor 106. Primary inductor 104 may or may not be coupled to the pair of varactors 116, which may account for a relatively small portion of the total capacitance of the VCO 100. In other embodiments, one or more switched capacitors 118 may be coupled to the primary inductor 104.

In some embodiments, the gain stage 108 may include a pair of cross-coupled transistors 122a-b (e.g., a first transistor 122a and a second transistor 122b). In one embodiment, the gate of the second transistor 122b may be coupled to the drain of the first transistor 122a at a first terminal 124 of the primary inductor 104, and the gate of the first transistor 122a may be coupled to the drain of second transistor 122b at a second terminal 126 of the primary inductor 104. The sources of first transistor 122a and second transistor 122b may be coupled to a ground terminal 128.

Figure 1B:
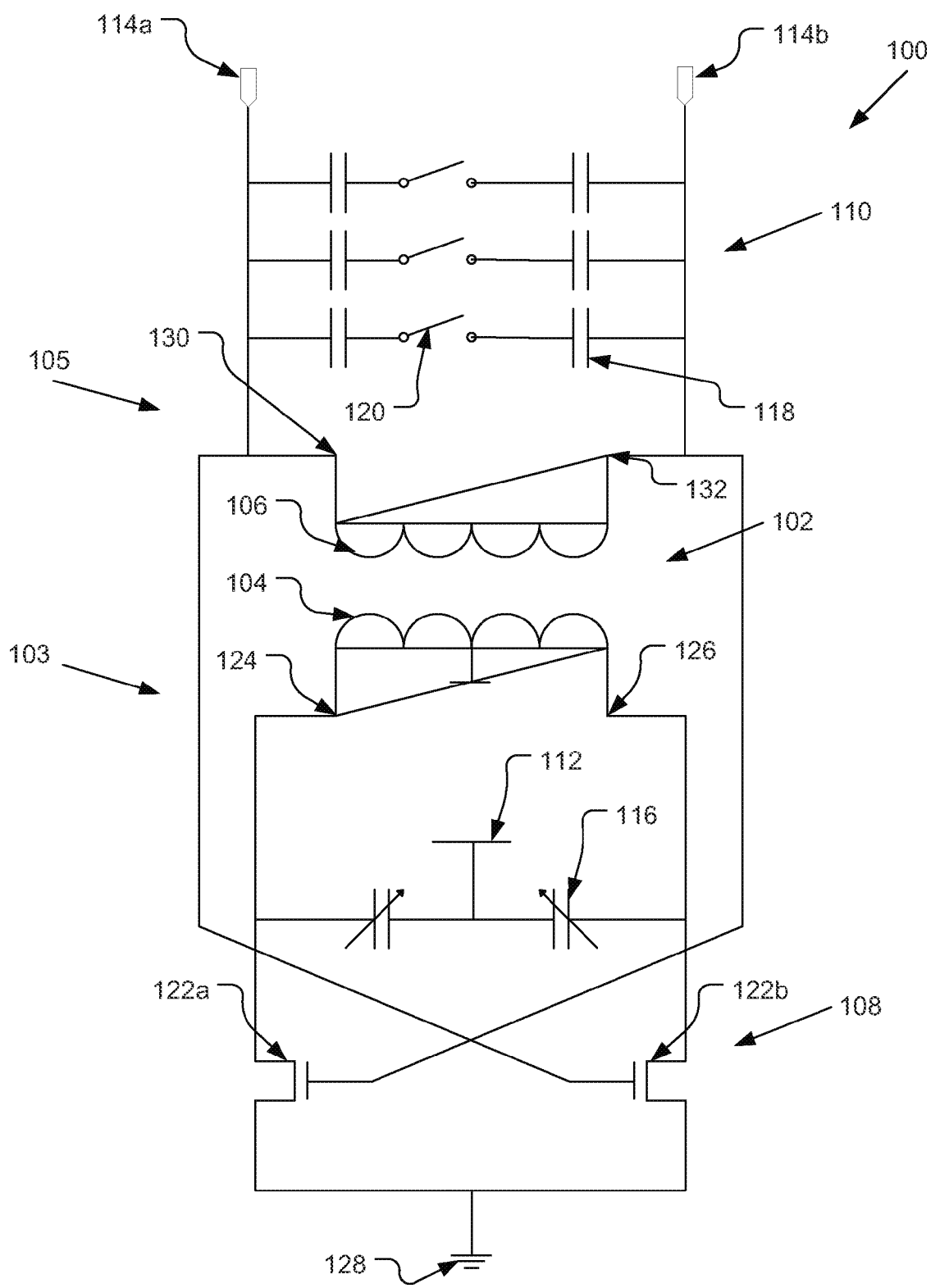
FIG. 1B is a circuit diagram of an alternative configuration of a voltage controlled oscillator in accordance with various embodiments.

FIG. 1B shows an alternate configuration of gain stage 108 in VCO 100 in which the gates of the transistors 122a-b are coupled to the secondary stage 105. As shown in FIG. 1B, the gate of the second transistor 122b may be coupled to a first terminal 130 of the secondary inductor 106, and the gate of the first transistor 122a may be coupled to a second terminal 132 of the secondary inductor 106. Transistors 122a-b may still be cross-coupled in the configuration shown in FIG. 1B, since the gate of each transistor 122a-b may be coupled to the terminal of 132 or 130, respectively, of the secondary inductor 106 on the opposite side of VCO 100 from the terminal 124 or 126, respectively, to which the drain of the transistor 122a-b is coupled.

Although the first and second transistors 122a and 122b, respectively, are shown in FIGS. 1A-B as n-type transistors (e.g., n-type metal-oxide-semiconductor (NMOS) transistors), in other embodiments, the first and second transistors 122a and 122b may be p-type transistors (e.g., p-type metal-oxide-semiconductor (PMOS) transistors). Alternatively, one of the first transistor 122a or second transistor 122b may be an n-type transistor, and the other may be a p-type transistor. Furthermore, embodiments may be include any VCO topology having a transformer with the gain stage driving the primary stage of the transformer, and a majority of the total capacitance load of the VCO coupled to the secondary stage of the transformer.

In various embodiments, the input signal may be provided by a supply source (not shown), such as a voltage source and/or a current source. In some embodiments, the supply source may be coupled to the VCO 100 at the supply node 112 as shown in FIGS. 1A-B. In other embodiments, the supply source may be coupled to a different node from the supply node 112 shown in FIGS. 1A-B, such as at the sources of first transistor 122a and second transistor 122b.

In various embodiments, the primary inductor 104 and/or secondary inductor 106 may have any suitable number of turns. In some embodiments, the primary inductor 104 and secondary inductor 106 may have the same number of turns. In other embodiments, the primary inductor 104 may have more turns or less turns than the secondary inductor 106.

Figure 2:
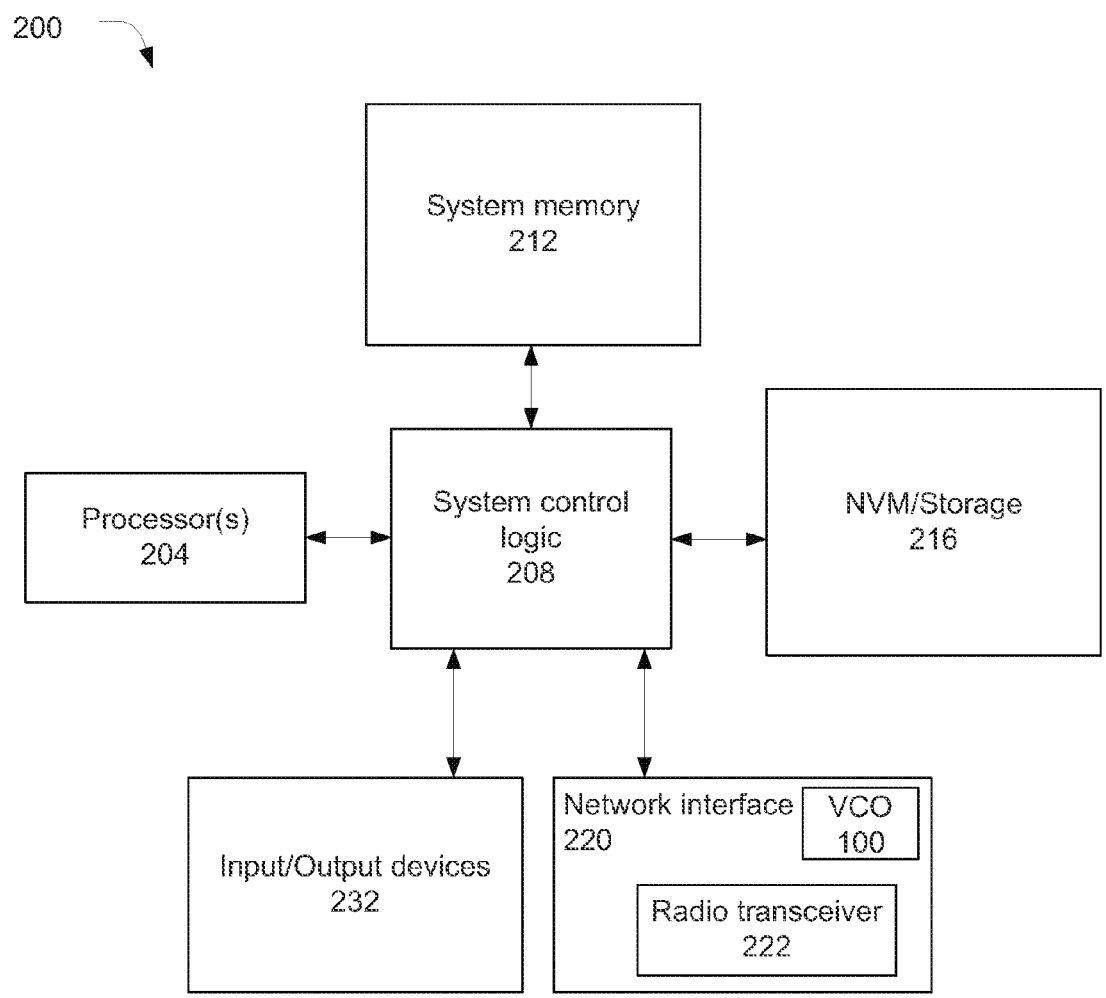
FIG. 2 is a block diagram of a wireless communications device including a voltage controlled oscillator in accordance with various embodiments.

The VCO 100 described herein may be incorporated into a variety of systems. FIG. 2 illustrates, for one embodiment, an example system 200 comprising one or more processor(s) 204, system control logic 208 coupled to at least one of the processor(s) 204, system memory 212 coupled to system control logic 208, non-volatile memory (NVM)/storage 216 coupled to system control logic 208, and a network interface 220 coupled to system control logic 208. In various embodiments, the system 200 may be a wireless communication device.

The one or more processor(s) 204 may include one or more single-core or multi-core processors. The one or more processor(s) 204 may include any combination of general-purpose processors and dedicated processors (e.g., graphics processors, application processors, etc.).

System control logic 208 for one embodiment may include any suitable interface controllers to provide for any suitable interface to at least one of the processor(s) 204 and/or to any suitable device or component in communication with system control logic 208.

System control logic 208 for one embodiment may include one or more memory controller(s) to provide an interface to system memory 212. System memory 212 may be used to load and store data and/or instructions, for example, for system 200. System memory 212 for one embodiment may include any suitable volatile memory, such as suitable dynamic random access memory (DRAM), for example.

NVM/storage 216 may include one or more tangible, non-transitory computer-readable media used to store data and/or instructions, for example. NVM/storage 216 may include any suitable non-volatile memory, such as flash memory, for example, and/or may include any suitable non-volatile storage device(s), such as one or more hard disk drive(s) (HDD(s)), one or more compact disk (CD) drive(s), and/or one or more digital versatile disk (DVD) drive(s), for example.

The NVM/storage 216 may include a storage resource physically part of a device on which the system 200 is installed or it may be accessible on by, but not necessarily a part of, the device. For example, the NVM/storage 216 may be accessed over a network via the network interface 220.

Network interface 220 may have a radio transceiver 222 to provide a radio interface for system 200 to communicate over one or more network(s) and/or with any other suitable device. Network interface 220 may include any suitable hardware and/or firmware. Network interface 220 may include one or more antennas. For example, network interface 220 may include a plurality of antennas to provide a MIMO radio interface. Network interface 220 for one embodiment may include, for example, a network adapter, a wireless network adapter, a telephone modem, and/or a wireless modem.

In some embodiments, the transceiver 222 may be configured to transmit and/or receive data signals over a wireless communications network. The data signals may be transmitted and/or received with a carrier frequency. In other embodiments, the transceiver 222 may send the data signals over a wireline network and/or another communications interface.

In various embodiments, the VCO 100 may be coupled to the transceiver 222 to facilitate the transceiver 222 to send and/or receive the data signals. The VCO 100 may provide the transceiver 222 with the output signal of the VCO 100, and the resonant frequency of the VCO 100 may be adjusted (e.g., by controlling switches 120 and/or the input signal and supply node 112) to produce an output signal having a frequency equal to the carrier frequency. The transceiver 222 may use the output signal of the VCO 100 to transmit and/or receive the data signals over the wireless communication network.

In some embodiments, the system 200 may be used in wireless communication networks that employ orthogonal frequency division multiple access (OFDMA) communications as used by multicarrier transmission schemes presented in, e.g., the Institute of Electrical and Electronics Engineers (IEEE) 802.16—2009, approved May 13, 2009, along with any amendments, updates, and/or revisions, 3rd Generation Partnership Project (3GPP) long-term evolution (LTE) project, advanced LTE project, ultra mobile broadband (UMB) project (also referred to as "3GPP2"), etc. In other embodiments, communications may be compatible with additional/alternative communication standards and/or specifications.

For one embodiment, at least one of the processor(s) 204 may be packaged together with logic for one or more controller(s) of system control logic 208. For one embodiment, at least one of the processor(s) 204 may be packaged together with logic for one or more controllers of system control logic 208 to form a System in Package (SiP). For one embodiment, at least one of the processor(s) 204 may be integrated on the same die with logic for one or more controller(s) of system control logic 208. For one embodiment, at least one of the processor(s) 204 may be integrated on the same die with logic for one or more controller(s) of system control logic 208 to form a System on Chip (SoC).

The system 200 may further include input/output (I/O) devices 232. The I/O devices 232 may include user interfaces designed to enable user interaction with the system 200, peripheral component interfaces designed to enable peripheral component interaction with the system 200, and/or sensors designed to determine environmental conditions and/or location information related to the system 200.

In various embodiments, the user interfaces could include, but are not limited to, a display (e.g., a liquid crystal display, a touch screen display, etc.), a speaker, a microphone, one or more cameras (e.g., a still camera and/or a video camera), a flashlight (e.g., a light emitting diode flash), and a keyboard.

In various embodiments, the peripheral component interfaces may include, but are not limited to, a non-volatile memory port, an audio jack, and a power supply interface.

In various embodiments, the sensors may include, but are not limited to, a gyro sensor, an accelerometer, a proximity sensor, an ambient light sensor, and a positioning unit. The positioning unit may also be part of, or interact with, the network interface 220 to communicate with components of a positioning network, e.g., a global positioning system (GPS) satellite.

In various embodiments, the system 200 may be a mobile computing device such as, but not limited to, a laptop computing device, a tablet computing device, a netbook, a smartphone, etc. Additionally, or alternatively, the system 200 may be a desktop computing device (e.g., a personal computer), a set-top box, and/or a wireless base station (e.g., an evolved NodeB (eNodeB), access point (AP), etc.). In various embodiments, system 200 may have more or less components, and/or different architectures.

In further embodiments, VCO 100 and/or VCO 200 may be incorporated into other devices and/or for other purposes, such as to facilitate wireline communications between devices, and/or to facilitate communications between different components of the same device.

Although certain example methods, apparatus, and articles of manufacture have been described herein, the scope of coverage of the present disclosure is not limited thereto. On the contrary, the present disclosure covers all methods, apparatus, and articles of manufacture fairly falling within the scope of the appended claims either literally or under the doctrine of equivalents. For example, although the above discloses example systems including, among other components, software or firmware executed on hardware, it should be noted that such systems are merely illustrative and should not be considered as limiting. In particular, it is contemplated that any or all of the disclosed hardware, software, and/or firmware components could be embodied exclusively in hardware, exclusively in software, exclusively in firmware or in some combination of hardware, software, and/or firmware.

What is claimed is:

1. A circuit comprising:
   a radio transceiver to transmit or receive a wireless communication signal with a carrier frequency via a wireless communication network; and
   a voltage controlled oscillator (VCO) coupled to the radio transceiver, the VCO including:
      a transformer including a primary inductor and a secondary inductor having a same number of turns, wherein the secondary inductor is configured to be inductively coupled to the primary inductor;
      a capacitor bank coupled to the secondary inductor, the capacitor bank to provide a majority of a total capacitance of the VCO; and
      a gain stage coupled to the primary inductor, the gain stage to receive a supply signal and to drive a current in the primary inductor to generate an output signal across the secondary inductor having a frequency substantially equal to a resonant frequency of the VCO.

2. The circuit of claim 1, wherein the radio transceiver is to transmit the wireless communication signal, and wherein the frequency of the output signal corresponds to the carrier frequency.

3. The circuit of claim 1, wherein the VCO further comprises one or more varactors coupled to the gain stage, the one or more varactors coupled in parallel with the primary inductor, and the one or more varactors to receive the supply signal.

4. The circuit of claim 1, wherein the capacitor bank comprises a plurality of switches, wherein individual switches within the plurality of switches are coupled to one or more capacitors of the capacitor bank to selectively couple the one or more capacitors in parallel with the secondary inductor.

5. The circuit of claim 1, wherein the primary inductor includes a center tap.

6. The circuit of claim 1, wherein the primary inductor includes a first terminal and a second terminal, and the gain stage includes a first transistor having a first drain and a first gate and a second transistor having a second drain and a second gate, wherein:
   the first drain is coupled to the first terminal;
   the second drain is coupled to the second terminal;
   the first gate is coupled to the second terminal; and
   the second gate is coupled to the first terminal.

7. The circuit of claim 1, wherein the primary inductor includes a first terminal and a second terminal, the secondary inductor includes a third terminal and a fourth terminal, and the gain stage includes a first transistor having a first drain and a first gate and a second transistor having a second drain and a second gate, wherein:
   the first drain is coupled to the first terminal;
   the second drain is coupled to the second terminal;
   the first gate is coupled to the fourth terminal; and
   the second gate is coupled to the third terminal.

8. The circuit of claim 1, wherein the capacitor bank is to receive a control signal different from the supply signal, the control signal to control a capacitance of the capacitor bank.

9. The circuit of claim 1, wherein the primary inductor and the secondary inductor have two turns.

10. The circuit of claim 1, wherein the current driven by the gain stage in the primary inductor is a differential current.

11. An integrated circuit, comprising:
   a radio transceiver to transmit or receive a wireless communication signal with a carrier frequency via a wireless communication network; and
   a voltage controlled oscillator (VCO) coupled to the transceiver to provide an output signal with an output frequency wherein the frequency of the output signal corresponds to the carrier frequency, and the VCO including:
      a transformer including a primary inductor and a secondary inductor, wherein the secondary inductor configured to be inductively coupled to the primary inductor;
      a gain stage coupled to the primary stage, the gain stage to induce the output signal at output terminals of the secondary stage; and
      a capacitor bank coupled to the secondary inductor, the capacitor bank to provide a majority of a total capacitance of the VCO.

12. The integrated circuit of claim 11, wherein the gain stage is to receive a supply signal and the capacitor bank is to receive a control signal different from the supply signal, and wherein the control signal is to control a capacitance of the capacitor bank.

13. The integrated circuit of claim 11, further comprising baseband circuitry to process the data signal.

14. The integrated circuit of claim 11, wherein the primary inductor and secondary inductor have a same number of turns.

15. The integrated circuit of claim 11, wherein the primary inductor includes a first terminal and a second terminal, and the gain stage includes a first transistor having a first drain and a first gate and a second transistor having a second drain and a second gate, wherein:
   the first drain is coupled to the first terminal;
   the second drain is coupled to the second terminal;
   the first gate is coupled to the second terminal; and
   the second gate is coupled to the first terminal.

16. The integrated circuit of claim 11, wherein the primary inductor includes a first terminal and a second terminal, the secondary inductor includes a third terminal and a fourth terminal, and the gain stage includes a first transistor having a first drain and a first gate and a second transistor having a second drain and a second gate, wherein:
   the first drain is coupled to the first terminal;
   the second drain is coupled to the second terminal;
   the first gate is coupled to the fourth terminal; and
   the second gate is coupled to the third terminal.

17. The integrated circuit of claim 11, wherein the output frequency is substantially equal to the carrier frequency.

18. The integrated circuit of claim 11, wherein the gain stage includes a pair of cross-coupled transistors.

19. A device comprising:
a plurality of antennas;
a processor; and
a network interface coupled with the processor and the plurality of antennas to provide a multiple input multiple output (MIMO) interface, the network interface including:
  a radio transceiver to transmit or receive a wireless communication signal with a carrier frequency via a wireless communication network using one or more of the antennas; and
  a voltage controlled oscillator (VCO) coupled to the radio transceiver to provide an output signal with an output frequency, wherein the frequency of the output signal corresponds to the carrier frequency, the VCO including:
    a transformer including a primary inductor and a secondary inductor, wherein the secondary inductor is configured to be inductively coupled to the primary inductor;
    a capacitor bank coupled to the secondary inductor, the capacitor bank to provide a majority of a total capacitance of the VCO, and the capacitor bank to receive a control signal to control a capacitance of the capacitor bank; and
    a gain stage coupled to the primary inductor, the gain stage to receive a supply signal different from the control signal, and the gain stage to drive a differential current in the primary inductor to generate the output signal across the secondary inductor.

20. The device of claim 19, further comprising a touch screen display coupled to the processor.

21. The device of claim 19, further comprising:
a battery coupled to the processor; and
a hard-disk drive (HDD) coupled to the processor.

22. The device of claim 19, further comprising:
a battery coupled to the processor; and
a non-volatile memory port coupled to the processor.

23. The device of claim 19, wherein the primary inductor includes a first terminal and a second terminal, and the gain stage includes a first transistor having a first drain and a first gate and a second transistor having a second drain and a second gate, wherein:
  the first drain is coupled to the first terminal;
  the second drain is coupled to the second terminal;
  the first gate is coupled to the second terminal; and
  the second gate is coupled to the first terminal.

24. The device of claim 19, wherein the output frequency is substantially equal to the carrier frequency.

25. A system comprising:
a processor;
system memory coupled to the processor;
a power supply interface coupled to the processor;
an audio connector coupled to the processor;
a network interface coupled with the processor, the network interface including:
  a radio transceiver to transmit or receive a wireless communication signal with a carrier frequency via a wireless communication network using the one or more antennas; and
  a voltage controlled oscillator (VCO) coupled to the radio transceiver to provide an output signal with an output frequency, wherein the frequency of the output signal corresponds to the carrier frequency, the VCO including:
    a transformer including a primary inductor and a secondary inductor, wherein the secondary inductor is configured to be inductively coupled to the primary inductor;
    a capacitor bank coupled to the secondary inductor, the capacitor bank to provide a majority of a total capacitance of the VCO, and the capacitor bank to receive a control signal to control a capacitance of the capacitor bank; and
    a gain stage coupled to the primary inductor, the gain stage to receive a supply signal different from the control signal, and the gain stage to drive a differential current in the primary inductor to generate the output signal across the secondary inductor.

26. The system of claim 25, wherein the output frequency is substantially equal to the carrier frequency.

* * * * *